United States Patent [19]

Suzuki et al.

[11] Patent Number: 6,108,428
[45] Date of Patent: Aug. 22, 2000

[54] TONE CONTROL DEVICE AND SOUND VOLUME/TONE CONTROL DEVICE FOR REDUCING NOISE AT THE TIME OF TONE MODIFICATION

[75] Inventors: Masaaki Suzuki; Masahiro Umewaka, both of Gunma-Ken, Japan

[73] Assignee: Sanyo Electric Co., Ltd, Osaka, Japan

[21] Appl. No.: 08/839,013

[22] Filed: Apr. 23, 1997

[30] Foreign Application Priority Data

Apr. 26, 1996 [JP] Japan ................................ 8-107832

[51] Int. Cl.[7] ...................................................... H03G 5/00
[52] U.S. Cl. ........................ 381/101; 381/104; 381/94.1; 381/102
[58] Field of Search .............................. 381/98, 101, 102, 381/103, 104, 109, 94.1

[56] References Cited

U.S. PATENT DOCUMENTS 5,528,695  6/1996  Klippel ..................... 381/106

FOREIGN PATENT DOCUMENTS

| 04200106 | 7/1992 | Japan ........................... H03G 3/02 |
| 04207610 | 7/1992 | Japan ........................... H03G 3/02 |
| 07142944 | 6/1995 | Japan ........................... H03G 3/00 |
| 7142944  | 6/1995 | Japan . |
| 07307629 | 11/1995 | Japan ........................... H03G 3/20 |

*Primary Examiner*—Ping Lee
*Attorney, Agent, or Firm*—Hogan & Hartson LLP

[57] ABSTRACT

A volume/tone control circuit comprises first and second latch circuits (8) and (9) for latching the volume control data BD and the tone control data TD stored in the shift register (7); a volume regulating circuit (2) and a tone regulating circuit (3) for regulating the volume and the tone of the input audio signal according to the respective output data of the first and second latch circuits (8) and (9); and a zero-crossing detection circuit (12) for detecting zero-crossings of the input signal. The input audio signal is fed to the zero-crossing detection circuit (12) when a data detection circuit (20) detects that the input data and the output data of the first latch circuit (8) differ. The output audio signal of the tone regulating circuit is fed to the zero-crossing detection circuit (12) when the input data and the output data of the second latch circuit (9) differ and they control data of either the first latch circuit or the second latch circuit is updated in response to the detection output of the zero-crossing detection circuit.

7 Claims, 2 Drawing Sheets

TONE CONTROL DEVICE AND SOUND VOLUME/TONE CONTROL DEVICE FOR REDUCING NOISE AT THE TIME OF TONE MODIFICATION

BACKGROUND OF THE INVENTION

1. Field of Invention

This invention relates to a device for controlling sound volume and tone of input audio signals and, more particularly, to a device for reducing the noise generated when sound volume or tone are regulated.

2. Related Art

A known sound volume control device disclosed in Japanese Patent Laid-Open No. 7-142944 (JP-A-07142944) comprises a sound volume regulating circuit for regulating sound volume according to a set of control data including the electronic volume and is adapted to reduce the switching noise generated at the time of regulating the sound volume by updating the control data to be fed to the volume regulating circuit in response to the output of a zero-crossing detection circuit arranged in the device for detecting zero-crossings in the input audio signal.

There have also been known similar devices comprising, in addition to a volume regulating circuit, a tone regulating circuit for regulating the tone according to a set of control data, using a zero-crossing detection circuit for detecting zero-crossings in the input audio signal.

FIG. 2 of the accompanying drawings shows a block diagram of a known volume/tone regulating circuit provided with a zero-crossing detection circuit. Referring to FIG. 2, the circuit comprises an input terminal 1 for receiving audio signals that are AC signals oscillating to alternately move into positive and negative zones relative to a reference voltage; a volume regulating circuit 2 for regulating the volume of the audio signal S received via the input terminal 1 according to a set of volume control data BD; a tone regulating circuit 3 for regulating the tone of the audio signal BS that has been regulated for volume according to a set of tone control data TD and transmitting the regulated audio signal TS to an output terminal 4; an interface circuit 6 for receiving the data transmitted from a microcomputer, transferring the data serially to a downstream shift register 7, and generating a storage completion signal E after the transfer; first and second latch circuits 8 and 9 for latching the volume control data BD and the tone control data TD out of the data stored in the shift register 7 according to write signals L1 and L2; and first and second decoders for decoding the output data of the first and second latch circuits 8 and 9 and feeding the decoded outputs to the volume regulating circuit 2 and the tone regulating circuit 3, respectively.

The volume/tone regulating circuit further comprises a zero-crossing detection circuit 12 for receiving the audio signal S applied to the input terminal 1 and detecting zero-crossings in the input audio signal by comparing the signal with a reference voltage, a storage completion flip-flop (FF) 13 to be set for operation by a storage completion signal E, and a signal generating circuit 14 for producing write signals L1 and L2 respectively to the first and second latch circuit 8 and 9 in response to the detection output of the zero-crossing detection circuit 12 after the generation of an output by the storage completion FF 13.

When volume control data BD and tone control data TD are transmitted from the microcomputer, the interface circuit 6 stores the transmitted data in the shift register 7 and generates a storage completion signal E to set the storage completion FF 13 for operation. Once the zero-crossing detection circuit 12 detects zero-crossings in the input audio signal S and generates a detection signal after the storage completion FF 13 is set for operation, the write signal generating circuit 14 outputs write signals L1 and L2 so that the new volume control data BD and the new tone control data TD stored in the shift register 7 are latched respectively to the first and second latch circuit 8 and 9 in order to update the existing volume control data BD and the tone control data TD.

Since the volume regulating circuit of the known device is designed to simply modify the extent of attenuation, no phase shift takes place before or after the regulating operation and, therefore, the zero-crossings of the input audio signal agrees with those of the output audio signal. Thus, the volume regulating circuit is satisfactorily effective for noise reduction.

On the other hand, however, since the tone regulating circuit modifies gain according to the frequency, the audio signal shows an advanced or retarded phase after the regulating operation. Therefore, the zero-crossings of the input audio signal do not agree with those of the output audio signal produced after regulation. In other words, If the tone is modified at zero-crossings of the input audio signal, a switching noise can be generated due to an abrupt change in the signal because the tone is modified at points that do not agree with zero-crossings of the output audio signal.

SUMMARY OF THE INVENTION

According to the invention, the above problem of known volume/tone regulating circuits is resolved by providing a tone control device comprising a tone regulating circuit for regulating the tone of the input audio signal according to a tone control data, a zero-crossing detection circuit for detecting zero-crossings in the output signal of the volume/tone regulating circuit, and a data updating circuit for updating the tone control data in response to the output of the zero-crossing detection circuit.

With a tone control device according to the invention, the tone regulating circuit regulates the tone of the input audio signal according to a tone control data. Therefore, the tone of the audio signal can be modified in a desired manner by changing the tone control data. Then, the zero-crossing detection circuit detects zero-crossings in the output signal of the tone regulating circuit and the data updating circuit updates tone control data in response to the output of zero-crossing detection circuit. Thus, the existing tone control data can be updated at zero-crossings of the signal that has been regulated for the tone.

Tone regulation is performed by modifying the gain according to the frequency. Therefore, the phase of the audio signal can often be changed before and after the tone regulation. In other words, zero-crossings of an audio signal that has been regulated for tone often differ from those of the input audio signal. Thus, noise can be generated if the tone control data are updated at points other than the zero-crossings of the input audio signal.

According to this invention, however, the noise generation can be effectively prevented because the tone control data are updated at zero-crossings of the audio signal that has been regulated for the tone.

In a preferred mode of the present invention, the data updating circuit comprises a register for storing externally supplied tone control data and a latch circuit for latching the tone control data stored in the register and the tone regulating circuit regulates the tone of the input audio signal according to the tone control data latched by the latch circuit. Thus, the tone control data are updated as the latch circuit latches data.

In another preferred mode of the invention, the data updating circuit further comprises a data detection circuit for comparing the tone control data stored the register and the tone control data latched by the latch circuit and detecting, a change of the tone control data stored in the register as a result of the comparison and, if the zero-crossing detection circuit detects zero-crossings in the output signal of the tone regulating circuit after the data detection circuit detects the change in the tone control data stored in the register, the latch circuit latches the changed new tone control data stored in the register to change the tone control data to be used by the tone regulating circuit.

In yet another preferred mode of the invention, there is also provided a completion signal output circuit for producing a completion signal when new tone control data are stored in the shift register and the write signal generating circuit produces a write signal for causing the latch circuit to latch the tone control data stored in the register in response to the detection output of the zero-crossing detection circuit after the generation of the storage completion signal. With this arrangement, the tone control data are updated with good timing.

According to another aspect of the invention, there is provided a volume/tone control device comprising a volume regulating circuit for regulating the volume of the input audio signal according to a volume control data, a tone regulating circuit for regulating the tone of the input audio signal according to a tone control data, a data detection circuit for detecting newly entered data as volume control data or tone control data, a switching circuit for transmitting the input audio signal when the data detection circuit detects the input of new volume control data and the output signal of the tone regulating circuit when the data detection circuit detects the input of new tone control data, a zero-crossing detection circuit for detecting zero-crossings of the input audio signal from the switching circuit or those of the output signal of the tone regulating circuit and a data updating circuit for updating the volume control data or the tone control data in response to the detection output of the zero-crossing detection circuit.

With such an arrangement, the volume control data are updated at zero-crossings of the input audio signal and the tone control data are updated at zero-crossings of the signal that has been regulated for the tone. Thus, noise generation can be prevented for both the update of the volume control data and that of the tone control data.

The arrangement for the update of the volume control data is preferably made similar to the arrangement for the update of the tone control data.

DETAILED DESCRIPTION OF THE INVENTION

Figure 1:
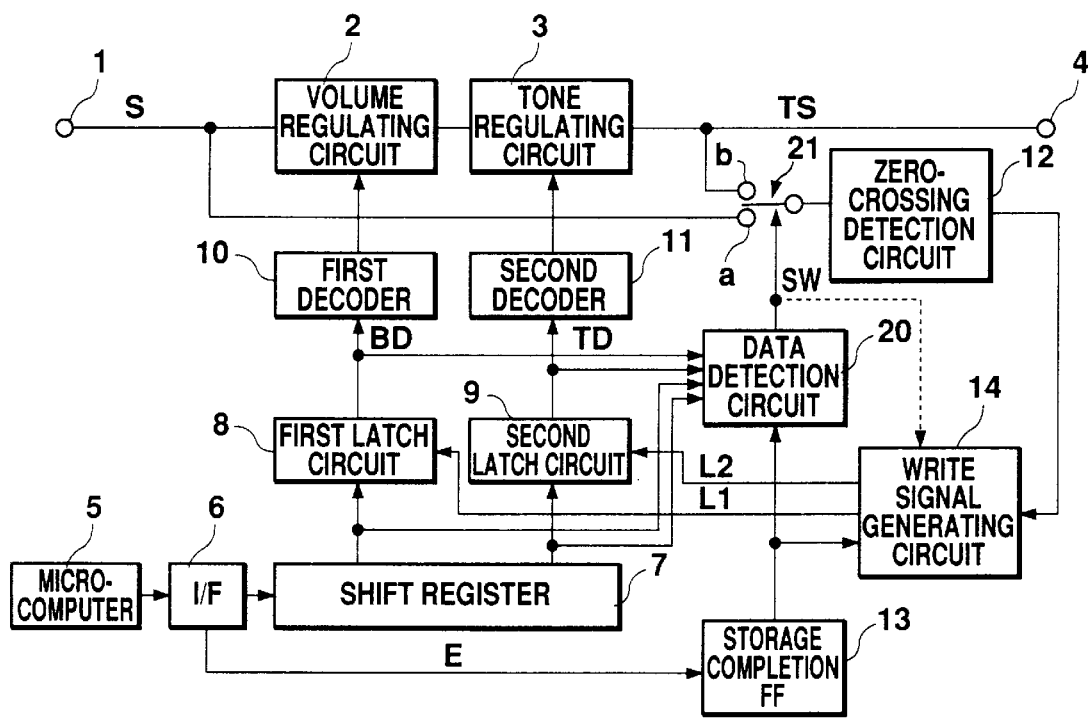
FIG. 1 is as block diagram of a preferred embodiment of the invention.
Figure 2:
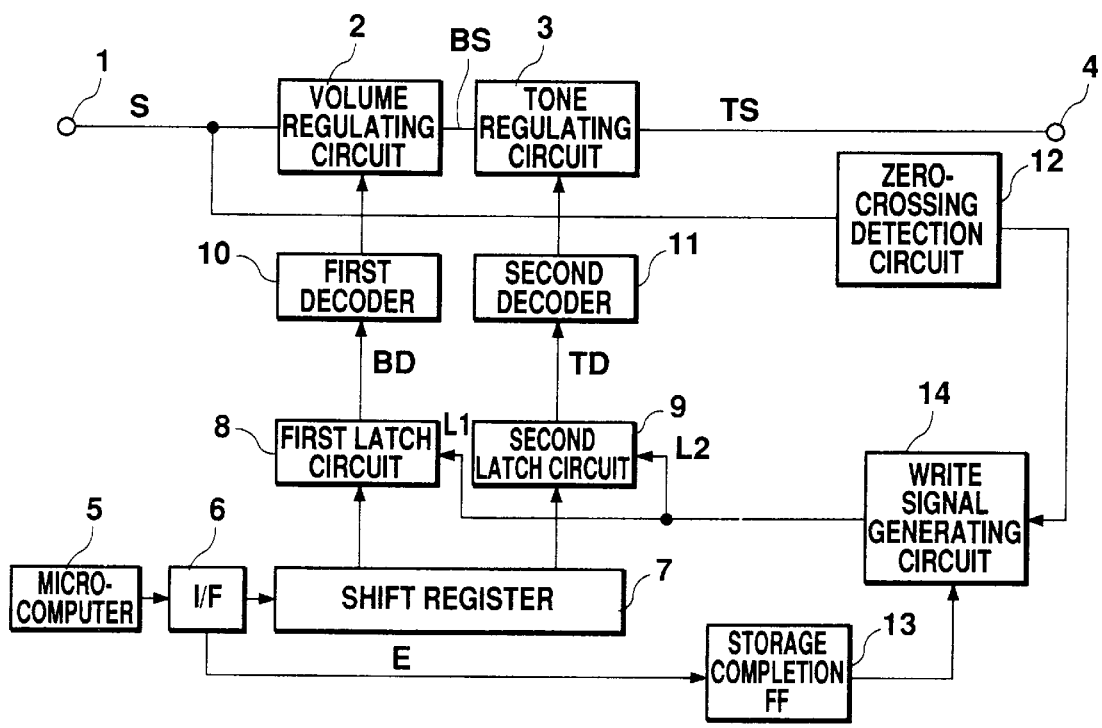
FIG. 2 is a block diagram of a comparable known device.

Now, the present invention will be described by way of a preferred embodiment. In FIG. 1 illustrating a block diagram of the embodiment, with components corresponding to those of the known device denoted by the same reference symbols. For the specific configuration of the zero-crossing detection circuit 12, reference should be made to Japanese Patent Laid-Open No. 7-142944 by the same inventor as the present application.

The embodiment of FIG. 1 is characterized by a data detection circuit 20 and a switching circuit 21. Upon receiving the output signal of the storage completion FF 13, the data detection circuit 20 takes in the input data and the output data of the first latch circuit 8, compares them, and brings the switching signal SW to level L when it finds, as a result of the comparison, that the values differ. The data detection circuit 20 also takes in the input data and the output data of the second latch circuit 9, compares them and brings the switching signal SW to level H when finds they are found to differ from each other as a result of the comparison. When the input audio signal S and the output audio signal TS of the tone regulating circuit 3 are applied respectively to the terminal a and the terminal b, the switching circuit 21 selects the input signal applied to the terminal a if the switching signal SW from the data detection circuit 20 is at level L and the input signal applied to the terminal b if the switching signal SW from the data detection circuit 20 is at level H. Then, one selected input signal is transmitted to the zero-crossing detection circuit 12.

For regulating only the volume, the microcomputer 5 transmits new volume control data that are different from those latched by the first latch circuit 8 and tone control data identical to those latched by the second latch circuit 9. Then, the data are stored in the shift register 7 by the interface 6 and, at the same time, a storage completion signal E is generated and the storage completion FF 13 is set for operation so that the output signal of the storage completion FF 13 is entered into the data detection circuit 20. In response to this input, the data detection circuit 20 takes in for comparison the input data and the output data of the first latch circuit 8, as well as the input data and the output data of the second latch circuit 9. Since the input data and the output data of the first latch circuit 8 are found by comparison to differ from each other, the data detection circuit 20 brings the switching signal SW to level L and the switching circuit 21 transmits the input audio signal S to the zero-crossing detection circuit 12 in response to the switching signal SW at level L. Thus, the zero-crossing detection circuit 12 detects zero-crossings of the input audio signal S.

When the zero-crossing detection circuit 12 outputs a detection signal after the generation of an output signal by the storage completion circuit FF 13, the write signal generating circuit 14 transmits respective write signals L1 and L2 to the first and second latch circuits 8 and 9 in response to the detection output in order to update the volume control data BD in the first latch circuit 8 by the newly entered data. Then the output of the first decoder 10 is changed in accordance with the update and the volume regulating circuit 2 performs the volume regulation in accordance with the updated volume control data BD. In other words, the volume is changed at zero-crossings of the input audio signal.

For regulating only the tone, on the other hand, the microcomputer 5 transmits the same volume control data as latched by the first latch circuit 8 and new tone control data different from those latched by the second latch circuit 9. Then, the data are stored in the shift register 7 by the interface 6 and, at the same time, a storage completion signal E is generated and the storage completion FF 13 is set for operation so that the output signal of the storage completion FF 13 is entered into the data detection circuit 20. In response to this input, the data detection circuit 20 takes in for comparison the input data and the output data of the first latch circuit 8 as well as the input data and the output data of the second latch circuit 9. Since the input data and the output data of the second latch circuit 9 are found to differ from each other, the data detection circuit 20 brings the switching signal SW to level H and the switching circuit 21 transmits the output audio signal TS of the tone regulating circuit to the zero-crossing detection circuit 12 in response to the switching signal SW at level H. Thus, the zero-crossing detection circuit 12 detects zero-crossings of the output audio signal TS of the tone regulating circuit 3 or zero-crossings of the audio signal whose phase has been shifted by the tone regulating circuit.

As in the case of volume regulating operation, the write signal generating circuit 14 transmits respective write signals L1 and L2 to the first and second latch circuits 8 and 9 in response to the detection output of the zero-crossing detection circuit 12 in order to update the tone control data TD in the second latch circuit 9 by the newly entered data. Then the output of the second decoder is changed in accordance with the update and the tone regulating circuit 3 performs the tone regulation in accordance with the updated tone control data TD. In other words, the tone is changed at zero-crossings of the audio signal whose phase has been changed.

For regulating both the volume and the tone, it will be sufficient to carry out a volume controlling operation and a tone controlling operation successively. More specifically, the microcomputer 5 transmits new tone control data that are different from those latched by the first latch circuit 8 and the same tone control data as those latched by the second latch circuit 9. Then, the operational sequence for regulating only the volume as described above is followed for volume regulation. Subsequently, the microcomputer 5 transmits the same volume control data as those latched by the first latch circuit 8 and tone control data that are different from those latched by the second latch circuit 9. Then, the operational sequence for regulating only the tone as described above is followed to complete the operation of regulating both the volume and the tone.

While the first and second latch circuits 8 and 9 transmit respective write signals at a same timing in the above embodiment, it may alternatively be arranged that switching signal SW is fed to the write signal generating circuit 14 so that write signal L1 or L2 is transmitted only to the latch circuit that updates the data in response to the switching signal SW. In other words, only write signal L1 is transmitted to update the data of the first latch circuit 8 when the switching signal SW is at level L, whereas only write signal L2 is transmitted to update the data of the second latch circuit 9 when the switching signal SW is at level H.

With this arrangement, both the volume and the tone can be regulated as the microcomputer 5 successively transmits volume control data different from those latched by the first latch circuit 8 and tone control data same as those latched by the second latch circuit 9 and the switching signal is sequentially switched by the data detection circuit 20. The data detection circuit 20 brings the switching signal SW to level L when the input data and the output data of the first latch circuit 8 are different from each other so that the switching circuit 21 selects the input audio signal S and sends it to the zero-crossing detection circuit 12, which in turn detects zero-crossings of the input audio signal S. Then, the write signal generating circuit 14 transmits a write signal L1 only to the first latch circuit 8 in response to the detection output of the zero-crossing detection circuit 12 and the first latch circuit 8 updates the volume control data BD, using the newly entered data. Subsequently, the data detection circuit 20 brings the switching signal SW to level H when the input data and the output data of the second latch circuit 9 differ so that consequently, the switching circuit 12 selects the output audio signal TS of the tone regulating circuit and transmits it to the zero-crossing detection circuit 12, which in turn detects zero-crossings of the output audio signal TS. Then, the write signal generating circuit 14 transmits a write signal L2 only to the second latch circuit 9 in response to the detection output of the zero-crossing detection circuit 12 and the second latch circuit 9 updates the tone control data TD, using the newly entered data.

With the above operation, both the volume and the tone can be regulated by the data transmitted only once from the microcomputer 5.

While the invention has been described in the preferred embodiment, it is to be understood that the wording chosen is intended to describe the invention rather than limit it from the true scope and spirit of the appended claims.

What is claimed is:

1. A tone control device comprising:
    a tone regulating circuit for regulating the tone of an input audio signal according to tone control data;
    a zero-crossing detection circuit for detecting zero-crossings in the output signal of the tone regulating circuit; and
    a data updating circuit for updating the tone control data in response to the output of the zero-crossing detection circuit, the data updating circuit including:
        an externally supplied register for storing the tone control data;
        a latch circuit for latching the tone control data stored in the register; and
        a data detection circuit for comparing the tone control data stored in the register and the tone control data latched by the latch circuit and detecting a change of the control data stored in the register in accordance with a result of this comparison;
    wherein the tone regulating circuit regulates the tone of the input audio signal according to the tone control data latched by the latch circuit,
    and wherein the latch circuit latches the changed tone control data stored in the register to change the tone control data to be used by the tone regulating circuit when the zero-crossing detection circuit detects zero-crossings in the output signal of the tone regulating circuit after the data detection circuit detects the change of the tone control data stored in the register.

2. A device according to claim 1, wherein the device further comprises a completion signal output circuit for producing a completion signal when new tone control data are stored in the register; and
    the write signal generating circuit produces a write signal for causing the corresponding latch circuit to latch the tone control data stored in the register in response to the detection output of the zero-crossing detection circuit after the generation of the storage completion signal.

3. A volume/tone control device comprising:
    a volume regulating circuit for regulating the volume of the input audio signal according to volume control data;
    a tone regulating circuit for regulating the tone of the input audio signal according to tone control data;
    a data detection circuit for detecting volume control data or tone control data in newly entered data;
    a switching circuit for transmitting the input audio signal when the data detection circuit detects the input of new volume control data or the output signal of the tone regulating circuit when the data detection circuit detects the input of new tone control data;

a zero-crossing detection circuit for detecting zero-crossings of the input audio signal from the switching circuit or those of the output signal of the tone regulating circuit; and a data updating circuit for updating the volume control data or the tone control data in response to the detection output of the zero-crossing detection circuit.

4. A device according to claim 3, wherein said data updating circuit comprises:

a shift register for storing the volume control data and the tone control data applied thereto;

a first latch circuit for latching the volume control data stored in the shift register;

a second latch circuit for latching the tone control data stored in the shift register; and a write signal generating circuit for supplying a write signal to either the first latch circuit or the second latch circuit in response to the detection output of the zero-crossing detection circuit; and the data detection circuit compares the input data and the output data of each of the first and second latch circuits to detect if new data are entered as volume control data or tone control data.

5. A device according to claim 4, wherein said data detection circuit carries out a detecting operation according to a storage completion signal indicating that data are stored in the shift register and the write signal generating circuit outputs a write signal in response to the detection output produced by the zero-crossing detection circuit after the generation of the storage completion signal.

6. A tone control device comprising:

a tone regulating circuit for regulating the tone of an input audio signal according to tone control data;

a zero-crossing detection circuit for detecting zero-crossings in the output signal of the tone regulating circuit;

a data updating circuit for updating the tone control data in response to the output of the zero-crossing detection circuit; and a data detecting circuit for detecting an input of new data as tone control data, wherein the data updating circuit updates the tone control data further in response to the output of the data detecting circuit.

7. A method for controlling the tone of an input audio signal to generate an output audio signal, comprising:

(a) detecting zero-crossings in the output audio signal;

(b) supplying updated tone control data to a tone regulating circuit in response to the output of the detecting step (a);

(c) regulating the tone of the input audio signal by the tone regulating circuit according to the supplied tone control data to generate the output audio signal;

(d) storing updated tone control data in a register; and (e) detecting whether updated tone control data is stored in the register, wherein step (a) is performed in response to the detecting result of step (e), and wherein step (b) comprises supplying the stored updated tone control data to the tone regulating circuit.

* * * * *